United States Patent
Omura (10) Patent No.: US 10,615,774 B2
(45) Date of Patent: Apr. 7, 2020

(54) ELASTIC WAVE DEVICE AND MANUFACTURING METHOD THEREFOR

(71) Applicant: Murata Manufacturing Co., Ltd., Nagaokakyo-shi, Kyoto-fu (JP)

(72) Inventor: Masashi Omura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 374 days.

(21) Appl. No.: 15/456,651

(22) Filed: Mar. 13, 2017

(65) Prior Publication Data

US 2017/0187352 A1   Jun. 29, 2017

Related U.S. Application Data (63) Continuation of application No. PCT/JP2015/075733, filed on Sep. 10, 2015.

(30) Foreign Application Priority Data

Sep. 30, 2014  (JP) .................................. 2014-200350

(51) Int. Cl.
| | |
|---|---|
| *H03H 9/25* | (2006.01) |
| *H03H 9/02* | (2006.01) |
| *H03H 9/56* | (2006.01) |
| *H03H 3/08* | (2006.01) |
| *H03H 9/145* | (2006.01) |
| *H03H 9/64* | (2006.01) |

(52) U.S. Cl.
CPC ............... *H03H 9/25* (2013.01); *H03H 3/08* (2013.01); *H03H 9/02125* (2013.01); *H03H 9/02228* (2013.01); *H03H 9/02952* (2013.01); *H03H 9/14502* (2013.01); *H03H 9/568* (2013.01); *H03H 9/6483* (2013.01)

(58) Field of Classification Search
CPC combination set(s) only.
See application file for complete search history.

(56) References Cited

U.S. PATENT DOCUMENTS

| | | | |
|---|---|---|---|
| 5,646,584 A | 7/1997 | Kondratyev et al. | |
| 5,949,144 A | 9/1999 | Delgado et al. | |
| 2004/0130239 A1 | 7/2004 | Kando et al. | |
| 2007/0024396 A1 | 2/2007 | Nam et al. | |

(Continued)

FOREIGN PATENT DOCUMENTS

| | | |
|---|---|---|
| CN | 1181624 A | 5/1998 |
| CN | 101034880 A | 9/2007 |

(Continued)

OTHER PUBLICATIONS

Official Communication issued in corresponding International Application PCT/JP2015/075733, dated Nov. 2, 2015.

(Continued)

*Primary Examiner* — Bryan P Gordon
(74) *Attorney, Agent, or Firm* — Keating & Bennett, LLP (57) ABSTRACT

In an elastic wave device, a piezoelectric substrate is stacked on a support substrate and an IDT electrode is provided on the piezoelectric substrate. Wiring line portions are provided on the piezoelectric substrate. A first hollow portion is provided in the support substrate at least below at least one of the wiring line portions and or below a region between the wiring line portions.

10 Claims, 5 Drawing Sheets

(56) References Cited

U.S. PATENT DOCUMENTS

| | | | |
|---|---|---|---|
| 2007/0188047 A1 | 8/2007 | Tanaka | |
| 2007/0267942 A1 | 11/2007 | Matsumoto et al. | |
| 2008/0143215 A1* | 6/2008 | Hara | H03H 3/04 |
| | | | 310/328 |
| 2010/0117483 A1* | 5/2010 | Tanaka | H03H 3/08 |
| | | | 310/313 B |
| 2012/0194033 A1* | 8/2012 | Tsuda | H03H 3/08 |
| | | | 310/313 C |
| 2013/0234805 A1 | 9/2013 | Takahashi | |
| 2013/0271238 A1* | 10/2013 | Onda | H03H 9/54 |
| | | | 333/133 |
| 2014/0125197 A1* | 5/2014 | Fujita | H01L 41/0477 |
| | | | 310/313 B |
| 2014/0152145 A1 | 6/2014 | Kando et al. | |
| 2014/0333392 A1* | 11/2014 | Tsuda | H03H 9/02992 |
| | | | 333/133 |

FOREIGN PATENT DOCUMENTS

| | | |
|---|---|---|
| CN | 103378817 A | 10/2013 |
| JP | 07-297669 A | 11/1995 |
| JP | 2002-152000 A | 5/2002 |
| JP | 2004-032132 A | 1/2004 |
| JP | 2004-236285 A | 8/2004 |
| JP | 2007-251910 A | 9/2007 |
| JP | 2007-312164 A | 11/2007 |
| JP | 2012-257019 A | 12/2012 |
| JP | 2013-214954 A | 10/2013 |
| JP | 2013-223025 A | 10/2013 |
| KR | 10-0631217 B1 | 10/2006 |
| KR | 10-2008-0037546 A | 4/2008 |
| WO | 2012/073871 A1 | 6/2012 |

OTHER PUBLICATIONS

Official Communication issued in Japanese Patent Application No. 2016-551880, dated Mar. 20, 2018.

Official Communication issued in Korean Patent Application No. 10-2017-7004051, dated Nov. 28, 2018.

Official Communication issued in corresponding Chinese Patent Application No. 201580049196.6, dated Jan. 20, 2020.

English translation of Official Communication issued in corresponding Chinese Patent Application No. 201580049196.6, dated Jan. 20, 2020.

* cited by examiner

ELASTIC WAVE DEVICE AND MANUFACTURING METHOD THEREFOR

CROSS REFERENCE TO RELATED APPLICATIONS

This application claims the benefit of priority to Japanese Patent Application No. 2014-200350 filed on Sep. 30, 2014 and is a Continuation Application of PCT Application No. PCT/JP2015/075733 filed on Sep. 10, 2015. The entire contents of each application are hereby incorporated herein by reference.

BACKGROUND OF THE INVENTION

1. Field of the Invention

The present invention relates to an elastic wave device such as an elastic wave resonator or an elastic wave filter, and to a manufacturing method therefor.

2. Description of the Related Art

Heretofore, various elastic wave devices have been used as resonators and band pass filters. Japanese Unexamined Patent Application Publication No. 2007-251910 discloses an elastic wave device in which Lamb waves are utilized as plate waves. In Japanese Unexamined Patent Application Publication No. 2007-251910, an IDT electrode is formed on a piezoelectric substrate. A reinforcement substrate having an opening therein that opens upward is bonded to a lower surface of the piezoelectric substrate. The opening is provided below a part of the piezoelectric substrate where the IDT electrode is provided. The opening is closed by the piezoelectric substrate and a hollow part is thus formed.

In elastic wave devices, in addition to an IDT electrode, a plurality of wiring lines are provided that are connected to the IDT electrode. Although there is no particular mention of such wiring lines in Japanese Unexamined Patent Application Publication No. 2007-251910, it is sometimes not possible to obtain good characteristics due to parasitic capacitances between wiring lines and so forth when an elastic wave device is actually manufactured.

SUMMARY OF THE INVENTION

Preferred embodiments of the present invention provide elastic wave devices that reduce capacitance between wiring lines and in which the characteristics thereof are unlikely to be degraded by parasitic capacitances and so forth.

An elastic wave device according to a preferred embodiment of the present invention includes a support substrate, a piezoelectric substrate that is stacked on the support substrate, an IDT electrode that is provided on the piezoelectric substrate, and a plurality of wiring line portions that are provided on the piezoelectric substrate and are electrically connected to the IDT electrode. A first hollow portion, which is covered by the piezoelectric substrate, is provided in the support substrate at least below at least one wiring line portion or below a region between wiring line portions among the plurality of wiring line portions.

In an elastic wave device according to a preferred embodiment of the present invention, a plate wave is utilized as an elastic wave, and an excitation-use second hollow portion, which is closed by the piezoelectric substrate, is provided in the support substrate below a region in which the IDT electrode is provided.

In an elastic wave device according to a preferred embodiment of the present invention, the first hollow portion and the second hollow portion are isolated from each other by a partition wall that is provided in the support substrate. In this case, the mechanical strength is increased by the partition wall.

In an elastic wave device according to a preferred embodiment of the present invention, the first hollow portion and the second hollow portion may be connected to each other.

In an elastic wave device according to a preferred embodiment of the present invention, a plate wave is utilized as an elastic wave, and the elastic wave device further includes an acoustic reflection film that is stacked on a lower surface of the piezoelectric substrate below the IDT electrode. A plate wave may be excited by providing an acoustic reflection film below the IDT electrode in this manner.

In an elastic wave device according to a preferred embodiment of the present invention, a leaky wave is utilized as an elastic wave.

An elastic wave device manufacturing method according to a preferred embodiment of the present invention includes a step of preparing the support substrate; a step of forming the first hollow portion, the first hollow portion being open at an upper surface of the support substrate; a step of stacking the piezoelectric substrate on the support substrate; and a step of forming the IDT electrode and the plurality of wiring line portions on the piezoelectric substrate.

In a method of manufacturing an elastic wave device according to a preferred embodiment of the present invention, the method further includes a step of forming the excitation-use second hollow portion in the support substrate.

In a method of manufacturing an elastic wave device according to a preferred embodiment of the present invention, the first hollow portion and the second hollow portion are simultaneously formed. In this case, an elastic wave device according to a preferred embodiment of the present invention can be provided while not increasing the number manufacturing steps.

With the elastic wave devices and the elastic wave device manufacturing methods according to various preferred embodiments of the present invention, the capacitance between wiring line portions is able to be reduced, and as a result, degradation of the characteristics of the elastic wave device caused by parasitic capacitances and so forth is effectively reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, the present invention will be made clearer by describing specific preferred embodiments of the present invention while referring to the drawings.

The preferred embodiments described in the present specification are illustrative examples and it should be noted that elements and features of the configurations illustrated in different preferred embodiments can be substituted for one another or combined with one another.

Figure 1:
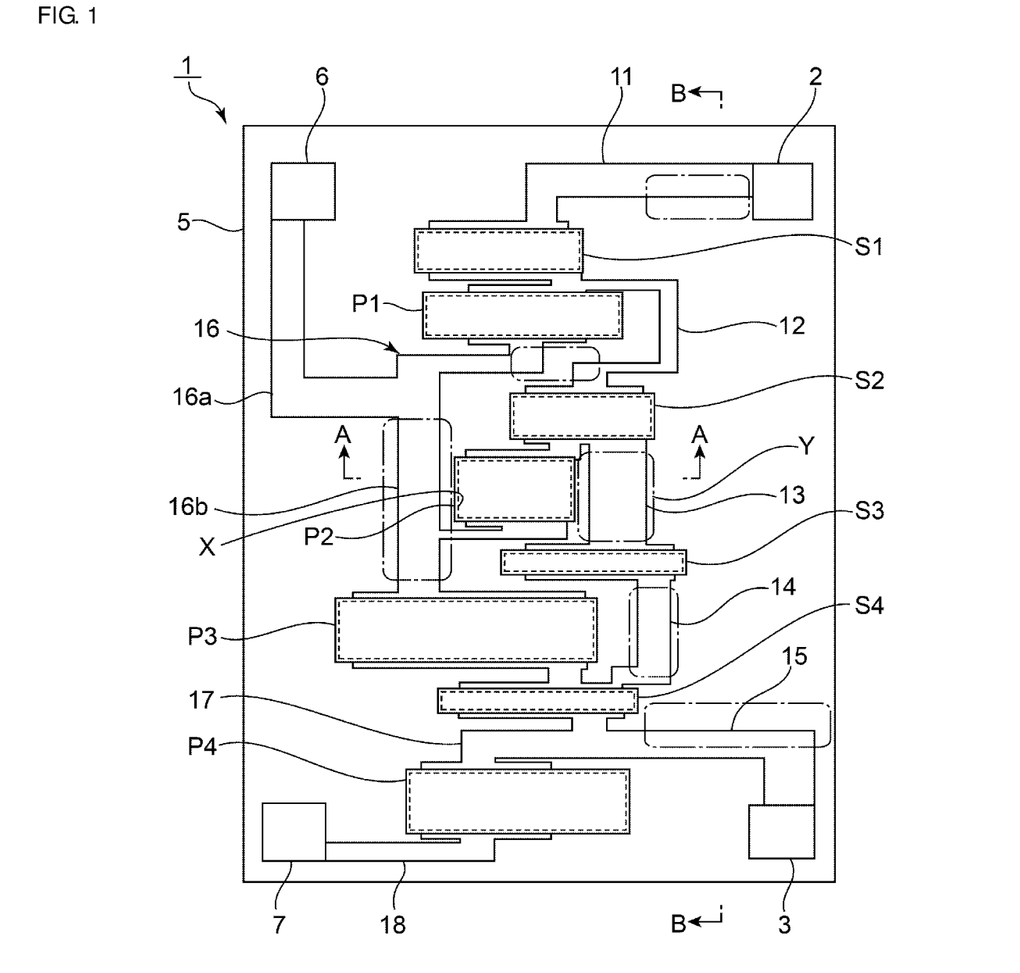
FIG. 1 is a schematic plan view for describing an elastic wave device according to a first preferred embodiment of the present invention.
Figure 2:
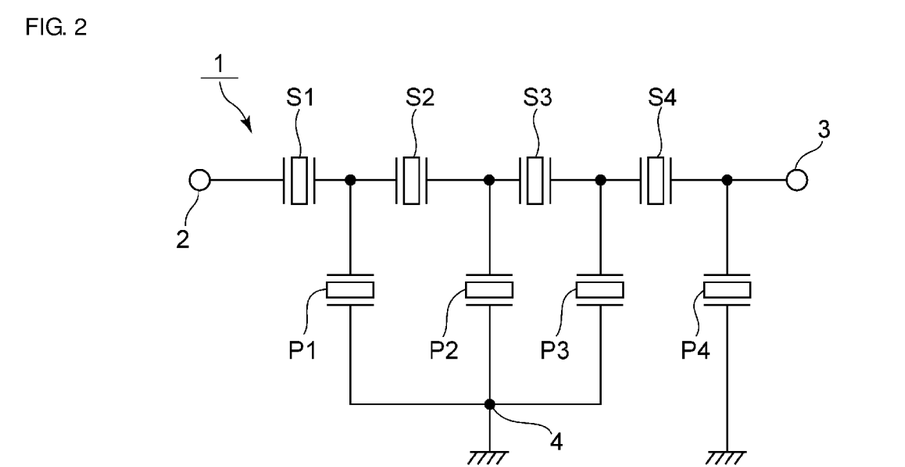
FIG. 2 illustrates the circuit configuration of the elastic wave device according to the first preferred embodiment of the present invention.

FIG. 1 is a schematic plan view of an elastic wave device 1 according to a first preferred embodiment of the present invention, and FIG. 2 illustrates the circuit configuration of the elastic wave device 1.

As illustrated in FIG. 2, the elastic wave device 1 preferably is a ladder filter, for example. A plurality of series-arm resonators S1 to S4 are provided in a series arm that connects an input terminal 2 and an output terminal 3. A parallel arm resonator P1 is provided in a parallel arm that connects a connection point between the series arm resonator S1 and the series arm resonator S2, and the ground potential. A parallel arm resonator P2 is provided in a parallel arm that connects a connection point between the series arm resonator S2 and the series arm resonator S3, and the ground potential. A parallel arm resonator P3 is provided in a parallel arm that connects a connection point between the series arm resonator S3 and the series arm resonator S4, and the ground potential. A parallel arm resonator P4 is provided in a parallel arm that connects a node between the series arm resonator S4 and an output terminal and the ground potential. Ground-potential-side end portions of the parallel-arm resonators P1 to P3 are commonly connected to a connection point 4.

The series arm resonators S1 to S4 and the parallel arm resonators P1 to P4 each include an elastic wave resonator. As illustrated in FIG. 1, the elastic wave device 1 includes a piezoelectric substrate 5. The piezoelectric substrate 5 includes a piezoelectric single crystal such as LiTaO$_3$ or LiNbO$_3$ in this preferred embodiment.

The schematically illustrated electrode structure is provided on the piezoelectric substrate 5. In more detail, the input terminal 2, the output terminal 3 and ground terminals 6 and 7 are provided on the piezoelectric substrate 5. Wiring line portions 11 to 15 are provided in order to define the series arm that connects the input terminal 2 and the output terminal 3 to each other. One end of the wiring line portion 11 is connected to the input terminal 2 and the other end of the wiring portion is connected to the series arm resonator S1. In FIG. 1, a portion where the series arm resonator S1 is provided is schematically illustrated as a rectangular shape, for example. In reality, a one-port-type elastic wave resonator is provided preferably by forming an IDT electrode and reflectors, which are arranged on both sides of the IDT electrode in the elastic wave propagation direction. A portion in which a one-port-type elastic wave resonator is provided is illustrated as a rectangular frame shape, for example. In addition, a broken line X inside a rectangular frame shape indicates a portion where a second hollow portion, which is used for excitation, is provided below the piezoelectric substrate 5, as will be described later. The outer edge of the second hollow portion is indicated by the broken line X in a plan view of the second hollow portion.

The other series-arm resonators S2 to S4 and the parallel arm resonators P1 to P4 are also schematically illustrated as similar rectangular frame shapes and regions in which the second hollow portions are provided are indicated by broken lines.

The wiring line portion 12 connects the series arm resonator S1 and the series arm resonator S2 to each other. The wiring line portion 13 connects the series arm resonator S2 and the series arm resonator S3 to each other. The wiring line portion 14 connects the series arm resonator S3 and the series arm resonator S4 to each other. The wiring line portion 15 connects the series arm resonator S4 and the output terminal 3 to each other.

On the other hand, a wiring line portion 16 is connected to an end portion of the parallel arm resonator P1 that is on the opposite side from the side that is connected to the series arm resonator S1. The wiring line portion 16 branches into first and second branch wiring line portions 16a and 16b. The first branch wiring line portion 16a is connected to the ground terminal 6. The second branch wiring line portion 16b is connected to end portions of the parallel arm resonator P2 and the parallel arm resonator P3 that are on the ground potential side. Therefore, the connection point 4 is defined by the wiring line portion 16.

The parallel arm resonator P4 is connected to a wiring line portion 17. The wiring line portion 17 is commonly connected to the wiring line portion 15 and is connected to the series arm resonator S4. In addition, a wiring line portion 18 is connected to an end portion of the parallel arm resonator P4 that is on the ground potential side. The wiring line portion 18 is connected to the ground terminal 7. The ladder circuit illustrated in FIG. 2 is provided on the piezoelectric substrate 5 in the manner described above.

The input terminal 2, the output terminal 3, the ground terminals 6 and 7 and the wiring line portions 11 to 18 are composed of a metal. As examples of the metal, a suitable metal or alloy such as Cu, Al, an Al—Cu alloy, Ag, or an Ag—Pd alloy can be used. In addition, a single metal film may be used, or a multilayer metal film obtained by stacking a plurality of metal films may be used.

The IDT electrodes and reflectors of the series-arm resonators S1 to S4 and the parallel arm resonators P1 to P4 can be formed of the same metals as described above.

In the elastic wave device 1, the second hollow portions indicated by the broken lines X described above are provided in order that the vibrations of the elastic wave resonators provided on the piezoelectric substrate 5 are not obstructed. This point will be explained while referring to the sectional view of FIG. 3.

Figure 3:
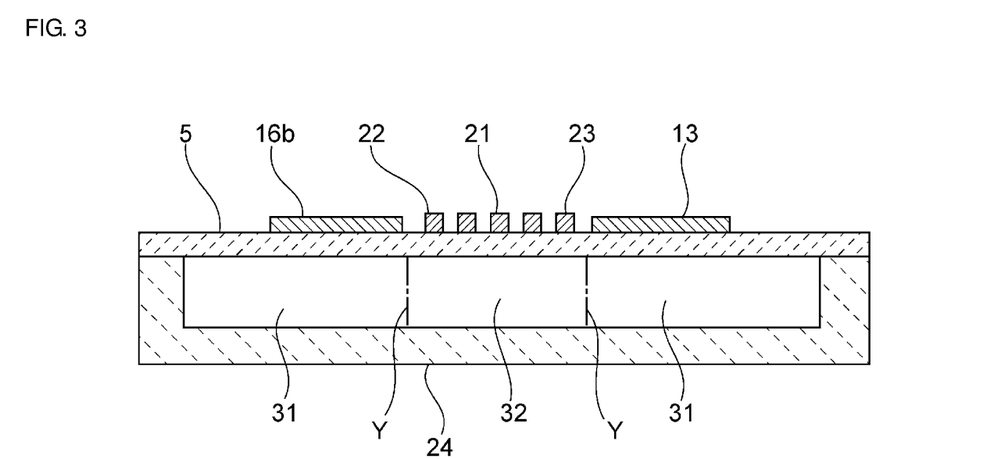
FIG. 3 is a sectional view of the elastic wave device of the first preferred embodiment of the present invention taken along line A-A in FIG. 1.

FIG. 3 is a sectional view taken along a broken line A-A in FIG. 1. An IDT electrode 21 and reflectors 22 and 23, which define the parallel arm resonator P2, are provided on the piezoelectric substrate 5. The branch wiring line portion 16b and the wiring line portion 13 are located outside the reflectors 22 and 23 in a surface acoustic wave propagation direction.

In the elastic wave device 1 of this preferred embodiment, plate waves are preferably utilized as the elastic waves. Therefore, the entirety of the portion of the piezoelectric substrate 5 where the IDT electrode 21 is provided vibrates. The thickness of the piezoelectric substrate 5 is small and therefore a support substrate 24 is stacked on a lower surface of the piezoelectric substrate 5. In other words, the piezoelectric substrate 5 is held by the support substrate 24.

An excitation-use second hollow portion 32 is provided below a region where the IDT electrode 21 and the reflectors 22 and 23 are provided in order to allow an elastic wave to be excited in the IDT electrode 21. In addition, first hollow portions 31, which will be described next, are connected to both sides of the excitation-use second hollow portion 32.

The first hollow portions 31 and the second hollow portion 32 are each defined by covering an opening, which opens at the upper surface of the support substrate 24, with the piezoelectric substrate 5.

The support substrate 24 can be made of a suitable insulating material, semiconductor material or piezoelectric material.

One of the unique features of the elastic wave device 1 of the present preferred embodiment is that the first hollow portions 31 are provided.

In FIG. 3, the first hollow portions 31 preferably are connected to and integrated with the second hollow portion 32, which is to the inside of the first hollow portions 31, with one-dot chain lines Y therebetween.

The first hollow portions 31 are respectively located below portions where the second branch wiring line portion 16b and the wiring line portion 13 are provided.

In this preferred embodiment, since the first hollow portions 31 are respectively provided below the second branch wiring line portion 16b and the wiring line portion 13, the parasitic capacitance between the second branch wiring line portion 16b and the wiring line portion 13 is able to be reduced. As a result, degradation of characteristics is significantly reduced or prevented.

In the elastic wave device 1, as described above, the thin piezoelectric substrate 5 is used, and in addition to the second hollow portions 32, similar first hollow portions are provided in portions surrounded by one-dot chain lines Y in FIG. 1.

Figure 4:
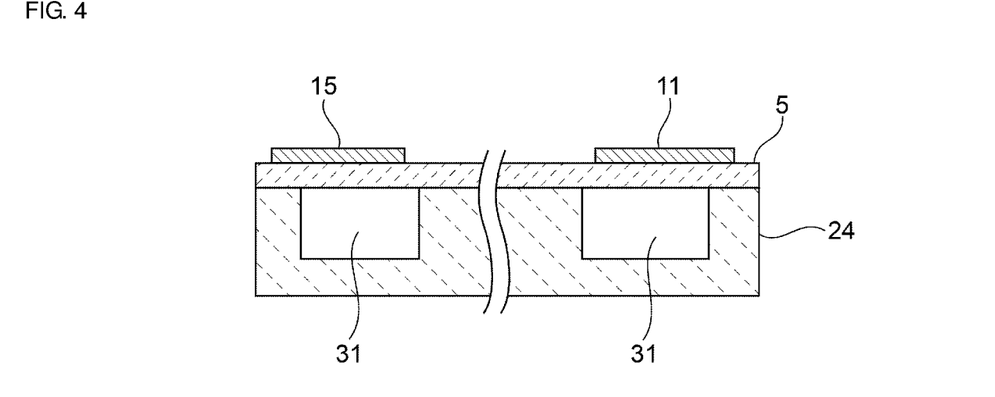
FIG. 4 is a sectional view of the elastic wave device according to the first preferred embodiment of the present invention taken along line B-B in FIG. 1.

FIG. 4 is a sectional taken along line B-B in FIG. 1. Here, the first hollow portions 31 are respectively provided below the wiring line portion 11 and below the wiring line portion 15. Therefore, a parasitic capacitance between the wiring line portion 11, which is connected to the input terminal 2 illustrated in FIG. 1, and the wiring line portion 15, which is connected to the output terminal 3, is able to be reduced. Thus, the first hollow portions 31 may be provided in order to reduce the parasitic capacitance between the wiring line portions 11 and 15, which do not have an IDT electrode provided therebetween.

As described above, it is clear that the parasitic capacitance between the wiring line portions is able to be effectively reduced by providing the first hollow portions in parts indicated by the one-dot chain lines Y in FIG. 1. In FIG. 4, the first hollow portions 31 are provided below the wiring line portions 11 and 15 in order to reduce the parasitic capacitance between the wiring line portion 11 and wiring line portion 15, which is considerably spaced apart from the wiring line portion 11.

Figure 5:
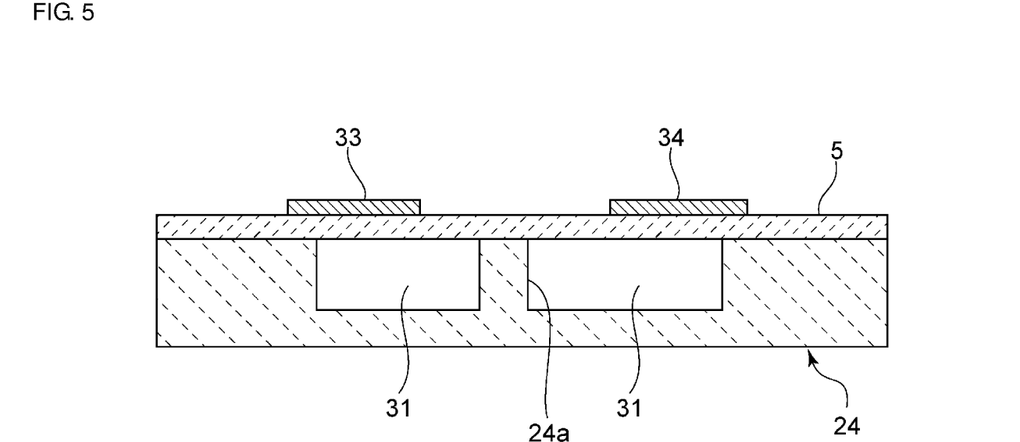
FIG. 5 is a sectional view of an elastic wave device according to a modification of the first preferred embodiment of the present invention.

In contrast, first hollow portions 31 may be respectively provided below wiring line portions 33 and 34, which are close to or adjacent to each other on the piezoelectric substrate 5, as in a modification illustrated in the sectional view of FIG. 5. In this modification, the first hollow portions 31 are adjacent to each other, and a partition wall 24a is provided therebetween. Therefore, deformation of the piezoelectric substrate 5 toward the first hollow portions 31 is able to be reduced. Therefore, the mechanical strength is able to be increased compared with a configuration in which the first hollow portions 31 are connected to each other.

Figure 6:
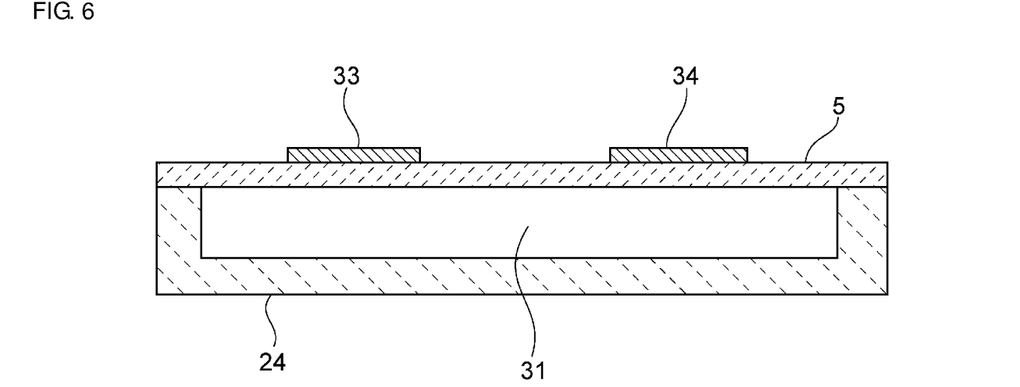
FIG. 6 is a sectional view of an elastic wave device according to a second modification of the first preferred embodiment of the present invention.

Of course, the first hollow portion 31 below the wiring line portion 33 and the first hollow portion 31 below the wiring line portion 34 may be integrated with each other as in a second modification illustrated in FIG. 6.

It is preferable that the parasitic capacitances between hot-side wiring lines such as the wiring line portion 11 and the wiring line portion 15 be made small. For example, if the parasitic capacitance between the wiring line portion 11 and the wiring line portion 15 is made small, attenuation of the ladder filter is able to be made sufficiently large. Therefore, it is preferable that first hollow portions 31 be provided in this manner below wiring line portions and/or below a region between wiring line portions in the case of such hot-side wiring line portions.

Figure 7:
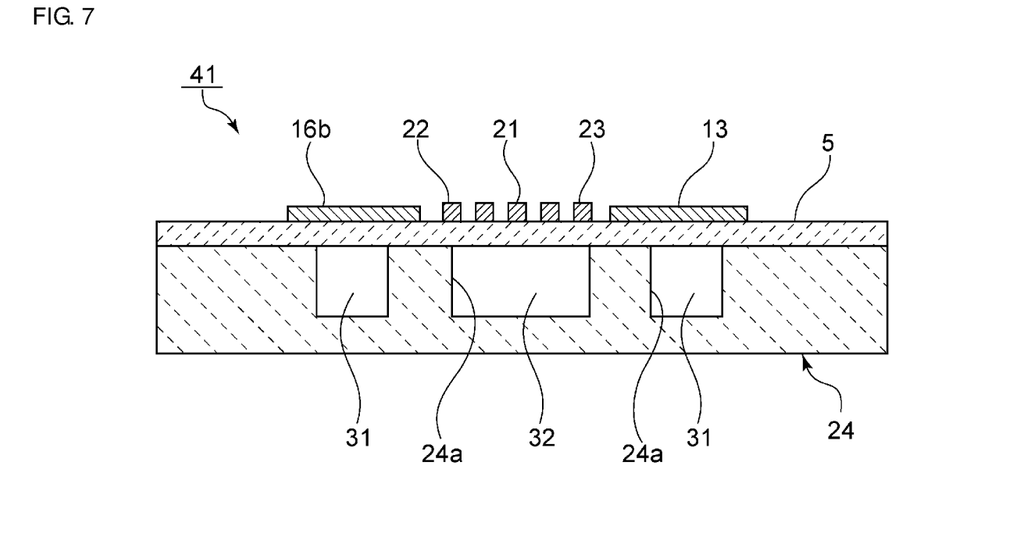
FIG. 7 is a front sectional view of an elastic wave device according to a second preferred embodiment of the present invention.

FIG. 7 is a front sectional view of an elastic wave device according to a second preferred embodiment of the present invention and corresponds to FIG. 3, which illustrates the first preferred embodiment. An elastic wave device 41 of the second preferred embodiment is preferably the same as that of the first preferred embodiment except that first hollow portions 31 and a second hollow portion 32 are separated from each other by partition walls 24a.

As is clear from comparing and contrasting FIG. 3 and FIG. 7, in the second preferred embodiment, a first hollow portion 31 that is below the branch wiring line portion 16b and a second hollow portion 32 that is below the IDT electrode 21 are separated from each other by a partition wall 24a. Similarly, a first hollow portion 31 that is below the wiring line portion is also separated from the second hollow portion 32 by a partition wall 24a. Therefore, compared with the structure illustrated in FIG. 3, the mechanical strength is able to be more effectively increased with the structure of the second preferred embodiment illustrated in FIG. 7.

In various preferred embodiments of the present invention, the first hollow portions are provided in order to reduce the parasitic capacitances between wiring line portions. Therefore, although it is sufficient for the first hollow portions to be provided below wiring line portions, the first hollow portions may be provided between wiring line portions. In other words, it is sufficient for a first hollow portion 31 to be provided at least below at least one wiring line portion or below a region between wiring line portions.

Figure 8:
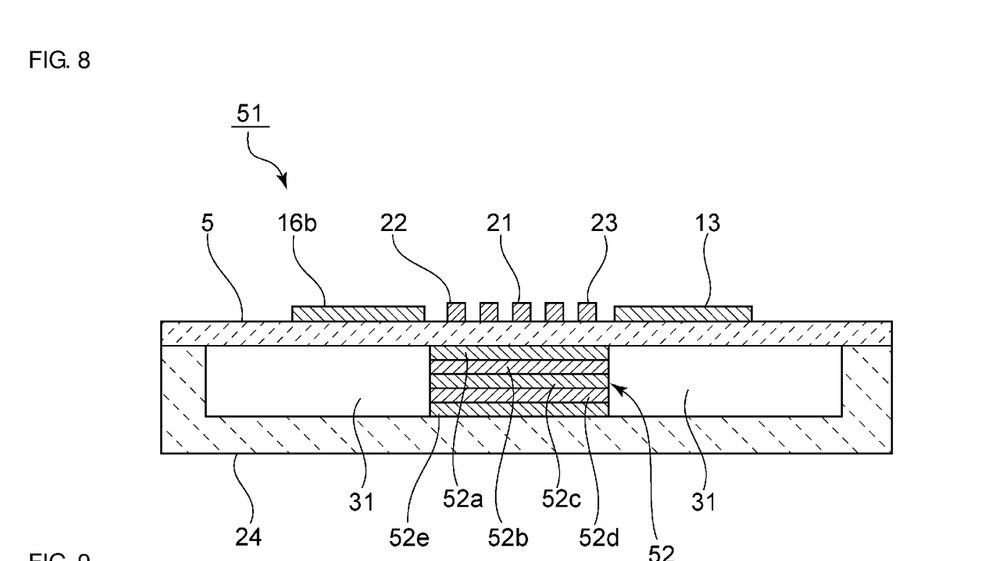
FIG. 8 is a front sectional view of an elastic wave device according to a third preferred embodiment of the present invention.

FIG. 8 is a front sectional view of an elastic wave device 51 according to a third preferred embodiment of the present invention. The elastic wave device 51 is preferably the same as that of the first preferred embodiment illustrated in FIG. 3 except that the second hollow portion 32 is not provided and an acoustic reflection film 52 is provided in place of the second hollow portion 32. Therefore, only this different portion will be described.

The acoustic reflection film 52 has a structure obtained by alternately stacking acoustic reflection films 52a, 52c, and 52e having a relatively low acoustic impedance and acoustic reflection films 52b and 52d having a relatively high acoustic impedance. Therefore, an elastic wave is reflected by the acoustic reflection film 52 and is confined to the piezoelectric substrate 5. Thus, even though the second hollow portion 32 is not provided, an elastic wave is able to be effectively excited using a thin piezoelectric substrate 5. The acoustic reflection film is not limited to above-described configuration, and it is sufficient that a layer having a relatively low acoustic impedance and a layer have a relatively high acoustic impedance be alternately stacked on top of one another.

Next, a non-limiting example of a method of manufacturing the elastic wave device 1 of the first preferred embodiment will be described.

First, the plate-shaped support substrate 24 is prepared.

Next, openings are formed in the support substrate 24 by performing etching or the like in portions of the support substrate 24 where the first hollow portions 31 and the second hollow portions 32 are to be formed. These openings, that is, openings that open at the upper surface of the support substrate 24, are filled with a sacrificial layer. As a result, the upper surface of the support substrate 24 is made flat.

The sacrificial layer is preferably made of a material that can be removed through a solvent treatment in a later step.

After forming the sacrificial layer, the piezoelectric substrate 5 is stacked on the upper surface of the support substrate 24. After that, the IDT electrodes 21, the reflectors 22 and 23, the plurality of wiring line portions 11 to 18, and the input terminal 2, the output terminal 3 and the ground terminals 6 and 7 are formed on the piezoelectric substrate 5 using a photolithography method. Next, through holes that are connected to the sacrificial layer are formed in the piezoelectric substrate 5 by performing etching. Finally, the sacrificial layer is removed by injecting a solvent from the through holes.

According to the example manufacturing method of this preferred embodiment, the first hollow portions 31 and the second hollow portions 32 are simultaneously formed. Therefore, it is possible to avoid a complicated manufacturing process. The second hollow portions 32 do not necessarily have to be provided in a preferred embodiment of the present invention. In other words, according to various preferred embodiments of the present invention, a parasitic capacitance between wiring line portions is able to be reduced so long as at least one first hollow portion is provided below a wiring line portion or between wiring line portions. Thus, the attenuation outside the pass band of a ladder filter is able to be increased and the characteristics of the ladder filter are able to be improved.

In the above-described preferred embodiments, plate waves preferably are used and therefore the thickness of the piezoelectric substrate 5 is small. Therefore, an etching hole is able to be easily formed in the piezoelectric substrate 5. Consequently, the sacrificial layer is able to be easily removed by performing etching.

Figure 9:
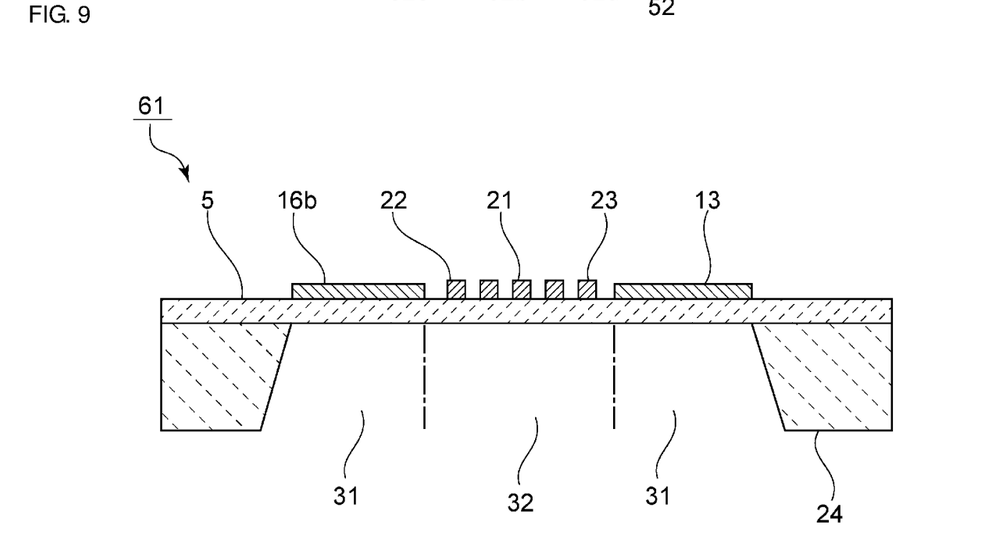
FIG. 9 is a schematic front sectional view of an elastic wave device according to a fourth preferred embodiment of the present invention.

FIG. 9 is a schematic front sectional view for describing a plate wave device according to a fourth preferred embodiment of the present invention. In an elastic wave device of the fourth preferred embodiment, the first and second hollow portions 31 and 32, which are provided in the support substrate 24, open at the lower surface of the support substrate 24. The first and second hollow portions 31 and 32 are connected to each other as in the case illustrated in FIG. 3. The piezoelectric substrate 5 is stacked on the support substrate 24 so as to cover the upper openings of the first and second hollow portions 31 and 32. The IDT electrode 21 is provided on the piezoelectric substrate 5. Thus, the first and hollow portions 31 and 32, which are provided in the support substrate 24, may open downwardly.

In addition, a structure may be adopted in which the first hollow portions 31 that are each provided below a wiring line portion or between wiring line portions also open downwardly as in the case of the second hollow portion 32 of the fourth preferred embodiment.

A non-limiting example of a manufacturing method of the fourth preferred embodiment will be described. The piezoelectric substrate is stacked on the surface of the support substrate 24, and then the thickness of the piezoelectric substrate is reduced. A piezoelectric substrate 5 having a prescribed thickness is formed in this way. Next, the IDT electrodes 21 are formed at prescribed positions on the piezoelectric substrate 5. After that, the first and second hollow portions 31 and 32 are formed in the support substrate 24.

In the above-described preferred embodiments, plate waves are preferably used, for example, but elastic waves other than a plate wave may be used. Possible examples of such elastic waves include surface acoustic waves, leaky waves and bulk waves.

Figure 10:
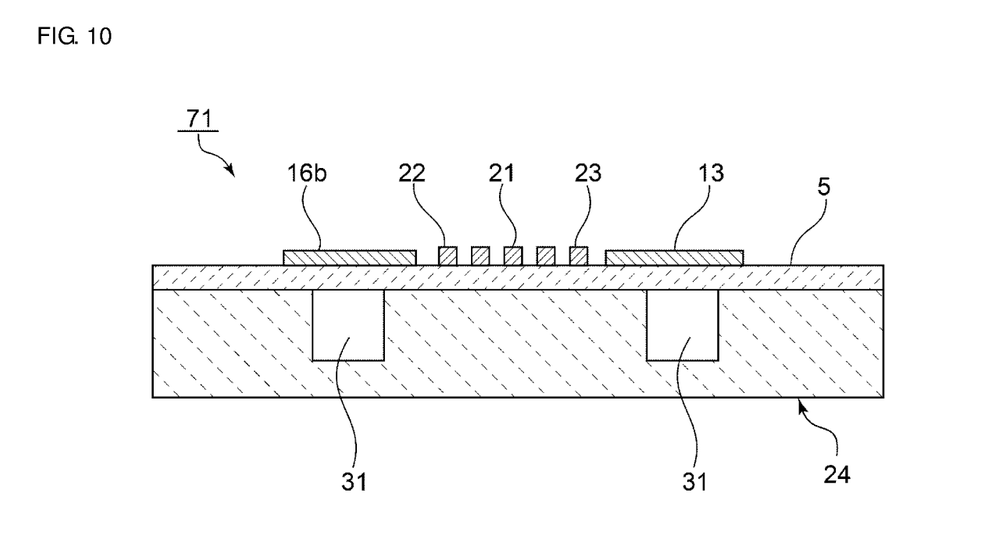
FIG. 10 is a front sectional view of an elastic wave device according to a fifth preferred embodiment of the present invention.

FIG. 10 is a front sectional view of an elastic wave device according to a fifth preferred embodiment of the present invention. An elastic wave device 71 does not include the second hollow portion or an acoustic reflection film. The piezoelectric substrate 5 of this preferred embodiment is preferably made of $LiTaO_3$ (LT). The elastic wave device 71 utilizes leaky waves. Of course, the piezoelectric substrate 5 may be composed of a piezoelectric single crystal other than $LiTaO_3$. In addition, elastic waves other than leaky waves may be used.

The first hollow portions 31 are provided in this preferred embodiment as well, and therefore, the parasitic capacitances between wiring line portions are able to be reduced.

An acoustic reflection film may be provided between the piezoelectric substrate and the support substrate. An elastic wave is able to be confined to the piezoelectric substrate in this way. Therefore, energy efficiency is able to be effectively increased.

Alternatively, a high acoustic velocity film may be stacked on the support substrate, a low acoustic velocity film may be stacked on the high acoustic velocity film, and a piezoelectric substrate may be stacked on the low acoustic velocity film. Here, "high acoustic velocity film" refers to a film in which the velocity of a bulk wave propagating therethrough is higher than that of an elastic wave propagating through the piezoelectric substrate. "Low acoustic velocity film" refers to a film in which the velocity of a bulk wave propagating therethrough is lower than the velocity of a bulk wave propagating through the piezoelectric substrate. An elastic wave is able to be confined to the piezoelectric substrate in this case as well.

In addition, a high acoustic velocity support substrate may be used in which a high acoustic velocity film and a support substrate are integrated with each other. The material of the high acoustic velocity support substrate may be silicon (Si), for example.

Furthermore, a ladder filter is described in the first preferred embodiment as a non-limiting example, but an elastic wave device of a preferred embodiment of the present invention may have the structure of another type of filter such as a longitudinally coupled resonator-type elastic wave filter, for example. In addition, preferred embodiments of the present invention are not limited to being applied to a filter, and preferred embodiments of the present invention can be applied to various elastic wave devices in which there is a demand to reduce the parasitic capacitances between wiring line portions.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder filter comprising:
    a support substrate;
    a piezoelectric substrate provided on the support substrate;
    an input terminal and an output terminal provided on the piezoelectric substrate;
    an IDT electrode provided on the piezoelectric substrate, and included in a series-arm connected to the input terminal and the output terminal;
    a first wiring line portion and a second wiring line portion provided on the piezoelectric substrate, and electrically connected to the IDT electrode;
    a first hollow portion provided below at least a portion of the first wiring line portion; and
    a second hollow portion provided below at least a portion of the second wiring line portion.

2. The ladder filter according to claim 1, wherein a third hollow portion is provided below a region in which the IDT electrode is provided.

3. The ladder filter according to claim 2, further comprising a partition wall provided in the support substrate to isolate the first hollow portion and the third hollow portion from each other.

4. The ladder filter according to claim 1, wherein the ladder filter has a structure that generates plate waves.

5. The ladder filter according to claim 1, wherein the ladder filter has a structure that generates leaky waves.

6. The ladder filter according to claim 2, further comprising a partition wall provided in the support substrate to isolate the second hollow portion and the third hollow portion from each other.

7. The ladder filter according to claim 3, further comprising a partition wall provided in the support substrate to isolate the second hollow portion and the third hollow portion from each other.

8. The ladder filter according to claim 1, wherein the first wiring line portion is connected to the input terminal, and the second wiring line portion is connected to the output terminal.

9. The ladder filter according to claim 1, wherein
    the IDT electrode includes a first IDT electrode and a second IDT electrode;
    the first wiring line portion is connected to the input terminal and the first IDT electrode; and
    the second wiring line portion is connected to the output terminal and the second IDT electrode.

10. A method for manufacturing a ladder filter comprising:
    providing a piezoelectric substrate on a support substrate;
    providing an input terminal and an output terminal on the piezoelectric substrate;
    providing an IDT electrode in a series-arm and on the piezoelectric substrate;
    providing a first wiring line portion and a second wiring line portion in the series arm and on the piezoelectric substrate;
    providing a first hollow portion below at least a portion of the first wiring line portion; and
    providing a second hollow portion below at least a portion of the second wiring line portion; wherein
    the first wiring line portion and the second wiring line portion are each electrically connected to the IDT electrode.

* * * * *